(12) United States Patent
Beric et al.

(10) Patent No.: US 8,009,174 B2
(45) Date of Patent: Aug. 30, 2011

(54) PROCESSING A DATA ARRAY WITH A MEANDERING SCANNING ORDER USING A CIRCULAR BUFFER MEMORY

(75) Inventors: Aleksandar Beric, Eindhoven (NL); Ramanathan Sethuraman, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 1012 days.

(21) Appl. No.: 11/908,965

(22) PCT Filed: Mar. 15, 2006

(86) PCT No.: PCT/IB2006/050804
§ 371 (c)(1),
(2), (4) Date: Sep. 18, 2007

(87) PCT Pub. No.: WO2006/100625
PCT Pub. Date: Sep. 28, 2006

(65) Prior Publication Data
US 2008/0215644 A1      Sep. 4, 2008

(30) Foreign Application Priority Data
Mar. 21, 2005   (EP) .................................. 05102241

(51) Int. Cl.
G09G 5/39       (2006.01)
G06F 13/18      (2006.01)
(52) U.S. Cl. ........................ 345/531; 345/535
(58) Field of Classification Search .................. None
See application file for complete search history.

(56) References Cited

U.S. PATENT DOCUMENTS

| | | | | |
|---|---|---|---|---|
| 5,381,528 A | * | 1/1995 | Brunelle | 710/56 |
| 5,561,633 A | * | 10/1996 | Yamano | 365/189.15 |
| 5,684,534 A | * | 11/1997 | Harney et al. | 375/240.25 |
| 6,009,231 A | * | 12/1999 | Aoki et al. | 386/68 |
| 6,640,245 B1 | * | 10/2003 | Shen et al. | 709/216 |
| 6,965,725 B1 | * | 11/2005 | Ichikawa et al. | 386/68 |
| 2002/0001347 A1 | | 1/2002 | Rhee | |
| 2003/0103567 A1 | | 6/2003 | Riemens | |
| 2003/0141435 A1 | | 7/2003 | Maguire | |
| 2003/0161403 A1 | | 8/2003 | Yang | |
| 2005/0200764 A1 | * | 9/2005 | Tsuruta et al. | 348/716 |

FOREIGN PATENT DOCUMENTS

| | | |
|---|---|---|
| EP | 1104197 A2 | 5/2001 |
| GB | 2275852 A | 9/1994 |
| JP | 08046929 | 2/1996 |

OTHER PUBLICATIONS

Beric, Aleksandar et al "A Technique for Reducing Complexity of Recursive Motion Estimation Algorithms", Signal Processing Systems, 2003, pp. 195-200.
De Greef, Eddy, et al "Program Transformation Strategies for Memory Size and Power Reduction of Pseudoregular Multimedia Subsystems" IEEE Transactions on Circuits and Systems for Video Technology, vol. 8, No. 6, Oct. 1998, pp. 719-733.

* cited by examiner

*Primary Examiner* — Kee M Tung
*Assistant Examiner* — Jacinta Crawford (57) ABSTRACT

A data buffering device which contains an input unit adapted to sequentially receive a two-dimensional array of data structures organized by an index pair with a first index stepwise traversing first-index values in a meandering manner defined by a first and a second meandering direction. The invention further includes a data buffering method, and a data processing method and device; each of which incorporates the above described features of the data buffering device.

21 Claims, 6 Drawing Sheets

PROCESSING A DATA ARRAY WITH A MEANDERING SCANNING ORDER USING A CIRCULAR BUFFER MEMORY

The present invention relates to a data buffering device comprising an input unit adapted to sequentially receive a two-dimensional array of data structures organized by an index pair with a first index stepwise traversing first-index values in a meandering manner defined by a first and a second meandering direction. The invention further relates to a data buffering method, and a data processing method and device.

Processing of a two-dimensional array of data structures is an ubiquitous task. It is of particular importance in image processing and video processing. With the arrival of new digital television signal standards like High-Definition Television (HDTV), and the spreading of low-end video formats such as CIF for video-conferencing, conversion between different video standards has become a task not only for professional studios in the broadcast chain, but also for consumer electronics devices. For example, image-rate conversion is now being performed by enhanced television displays having field rates up to 100 Hz, computer work stations and DVD players.

One branch of image-rate conversion techniques uses motion-compensated methods. Known methods for motion compensation are based on the principle that knowledge of object motion in a video sequence allows to interpolate image data between two successive video images. The interpolated image data is used to generate an intermediate image for display, and thus for increasing the image rate. The motion of objects in a video sequence is ascertained by motion estimation techniques. Typical motion estimation algorithms, such as described in US 2003/0103567 A1, apply block-based methods, in which for a selected pixel block, for instance containing 8×8 pixels, a search area is defined that surrounds the pixel block in the succeeding image, the selected pixel block being positioned in its center. The output of a motion estimation algorithm is a two-dimensional array of motion vectors, each motion vector being assigned to a respective pixel block. A motion vector is the projection of a motion trajectory on the image plain. A motion trajectory is the line that connects identical image parts in a sequence of video images.

A set of motion vectors allocated to the pixel blocks of a video image thus forms a two-dimensional array of data structures. A motion compensation process uses the motion vector allocated to a respective pixel block as an input. Since all display devices scan an image from left to right and from top to bottom, motion compensation methods follow this predefined standard scanning order.

US 2003/0161403 A1 describes a device for transforming a scanning format, in which a motion estimator provides a motion vector to a motion compensator. The motion estimator comprises a buffer memory for storing motion vectors, which are read by the motion compensator.

It has recently been shown that a meandering scanning order used in a motion estimation process increases the image quality of interpolated video images. In using a meandering scanning order, a motion estimation process scans consecutive pixel-block lines in opposite directions, e.g., a first pixel-block line from left to right, a neighboring second pixel-block line from right to left, a following third pixel-block line from left to right, and so forth. Similarly, a meandering scanning order can also be column-based, e.g., a first pixel-block column of a video image is scanned from top to bottom whereas a neighboring second pixel-block column is scanned from bottom to top, a consecutive third pixel-block column is scanned from top to bottom again, etc. Generally speaking, a meandering scanning order implies that one index of an index pair, which describes the arrangement of the pixel blocks, stepwise traverses an ordered set of index values, alternately in a first direction and an opposite second direction, with predefined boundary index values marking the turning points. At each turning point, the second index changes by one step in a predefined direction.

The use of different scanning orders in motion estimation and motion compensation algorithms makes buffering of the output of a motion estimator more difficult. Different motion vectors need to remain in the buffer for different time spans, until they are in order to be read by the motion compensator. The problem can be solved in an obvious manner by providing a buffer memory, which is large enough to store a complete meandering period of motion vectors. However, providing a larger buffer memory for compensating different scanning orders is costly with respect to chip area and energy consumption. In addition, buffering a larger number of motion vectors increases the latency between the two processes of a motion estimator and a motion compensator. The motion compensator is a complete meandering period, for example two-pixel block lines, behind the motion estimator.

It is an object of the present invention to provide a data buffering method and device that allows to decrease the storage capacity for data structures forming a two-dimensional array provided by a first process in a meandering order and to be read out by a second process having a non-meandering scanning order.

It is a further object of the invention to provide a data processing device having a first processing unit sequentially providing a two-dimensional array of data structures in a meandering manner, and a data buffering device, which allows to decrease the storage capacity of the buffer memory for reading access by a second processing unit having a non-meandering scanning order.

According to a first aspect of the invention, a data buffering device is provided, comprising an input unit adapted to sequentially receive a two-dimensional array of data structures organized by an index pair with a first index stepwise traversing first-index values in a meandering manner defined by a first and a second meandering direction, a circular buffer memory having a predetermined number of memory locations addressable by means of an ordered set of pointer values, and a buffer-control unit, which is connected to the circular buffer memory and to the input unit, and which is adapted to assign to an index pair of a current incoming data structure a write-pointer value from the pointer-value set in a periodical manner and to write the current incoming data structure to the corresponding memory location, one write-pointer assignment period having a first write-pointer assignment phase, during which the first index stepwise traverses the first index-value set in the first meandering direction, and the write pointer stepwise traverses pointer values in a first rotation direction defined within the pointer-value set, a second write-pointer assignment phase, during which the first index value changes in the second meandering direction, and the write pointer stepwise traverses pointer values in the first rotation direction, a third write-pointer assignment phase, during which the first index stepwise traverses the first index-value set in the first meandering direction, and the write pointer stepwise traverses pointer values in a second rotation direction opposite to the first rotation direction, and a fourth write-pointer assignment phase, during which the first index value changes in the second meandering direction, and the write pointer value stepwise traverses pointer values in the second rotation direction.

The data buffering device of the invention makes use of a circular buffer memory having a predetermined number of memory locations. Circular buffers are well known memory structures for the purpose of temporarily storing sequentially delivered data. While made up of only a finite number of memory locations, a circular buffer appears to be of limitless size, because it loops back on itself. As data are stored in contiguous memory locations within a circular buffer, eventually a physical end of the buffer is reached. In this situation, the buffer continues to receive and store data beginning at its other physical end.

The basic operation of a circular buffer shall be illustrated by way of an example. The buffer-control unit of a circular buffer sequentially storing incoming data structures increments a write-pointer value to its respective memory locations with each new data structure. The write pointer will eventually reach an upper boundary of the set of pointer values. At that point, the circular buffer of this example may continue to store further incoming data structures using write-pointer values beginning from the lowest pointer value and then further incrementing the pointer value. The data previously stored at these memory locations are overwritten. Thus, the addressing of the memory locations performed by the buffer-control unit follows an endless periodical pattern that can be visualized by a circle. The increase or decrease of pointer values is referred to as a change of pointer values in opposing rotation directions.

The size of a memory location within the circular buffer memory of the invention can be chosen in dependence on the size of data structures to be stored in the circular buffer memory. A memory location should at least have the capacity to store one complete data structure received. Therefore, a memory location typically comprises a plurality of memory cells. It is well known in the art how to address individual memory cells of a circular buffer memory on the basis of given pointer values.

The buffer-control unit of the data buffering device of the invention performs a periodical write-pointer assignment. The periodical nature of the pointer assignment is coupled to the change of index values allocated to the individual data structures of the two-dimensional array received at the input of the buffering device. One write-pointer assignment period has four write-pointer assignment phases. In each of the four phases, one index of the index pairs allocated to the incoming data structures stepwise traverses a given set of index values for that index. Which index changes with each incoming data depends on whether the data structures of the two-dimensional array are received linewise or columnwise. Typically, the index will cover a predefined range of index values in each write pointer-assignment phase. However, with each phase, the direction is changed, resulting in a meandering reception pattern at the input unit with respect the two-dimensional array.

The first write-pointer assignment phase is characterized by the index changing in a first meandering direction and the write pointer stepwise traversing pointer values in a first rotation direction defined within the pointer-value set. In the second write-pointer assignment phase, the first index value changes the meandering direction while the rotation direction of the write-pointer assignment is kept constant. In the third write-pointer assignment phase, the meandering direction again changes, and so does the rotation direction of the write pointer assignment. Finally, in a fourth write-pointer assignment phase, the rotation direction of the pointer assignment remains constant while the meandering direction has again changed.

For the purpose of illustration, incoming data structures may form a set of motion vectors calculated by with the aid of a motion estimator from pixel blocks forming a video image. Assuming that the corresponding motion vector matrix is provided to the data buffering device of the invention line by line, a complete write-assignment period covers four lines of motion vectors. While the meandering direction of data structures received at the input unit changes with each line, the rotation direction of the write-pointer assignment performed by the buffer-control unit changes every second line.

The data buffering device of the invention allows providing access to the stored data with a minimum memory space. The use of a circular buffer removes the need to store a complete meandering period of data structures in the buffer before a non-meandering process can have read access to the data structures. This is achieved by providing a buffer-control unit, which can change the rotation direction used in the assignment of write-pointer values. By making use of the coordinated change of meandering direction and rotation direction as set forth above, memory locations will not be overwritten before they have been read out. The coupling between meandering direction and write pointer assignment in the data buffering device of the invention also allows reducing the latency between writing to the buffer and reading from the buffer. This way, the data buffering device of the invention contributes to an increase of processing speed in data processing devices.

A further advantage of the data buffering device of the invention is that the size of an on-chip cache memory holding video data, which is used in share by the ME and MC processes, can also be reduced. This will be explained in more details with reference to a preferred embodiment shown in FIG. 7.

In the following, preferred embodiments of the buffering device of the invention will be described.

In a preferred embodiment, the buffer control unit is adapted to receive read requests to the circular-buffer memory for data structures of the two-dimensional array according to a non-meandering read pattern, such that the first index repeatedly traverses the first index-value set in a fixed read direction. A non-meandering read pattern uses the same direction of change of the first-index values for each line or column respectively.

Preferably, the buffer control unit is adapted to assign a read-pointer value to each index pair of a data structure, to which a read request is directed, the read-pointer value corresponding to the write-pointer value assigned to the respective index pair at the time of storing the corresponding data structure to the circular buffer memory.

In a further preferred embodiment, the number of addressable memory locations of the circular-buffer memory exceeds the number of first-index values by one, and wherein the buffer-control unit is adapted to assign to an index pair of a current incoming read request a read-pointer value from the pointer-value set in a periodical manner, one read-pointer-assignment period having a first read-pointer assignment phase, which is concurrent with the second write-pointer assignment phase, and in which the read pointer stepwise traverses respective current pointer values in the first rotation direction, having a pointer-value offset of one step in the first rotation direction over the write pointer, and changing from the first to the second rotation direction in the last assigning step, a second read-pointer assignment phase, which is concurrent with the third write-pointer assignment phase, and in which the read pointer stepwise traverses respective current pointer values in the second rotation direction, having a pointer-value offset of one step in the second rotation direction over the write pointer, a third read-pointer assignment phase, which is concurrent with the fourth write-pointer assignment phase, and in which the read pointer stepwise traverses respective current pointer values in the second rotation direction, having a pointer-value offset of one step in the second rotation direction over the write pointer, and changing from the second to the first rotation direction in the last assigning step, and a fourth read-pointer assignment phase, which is concurrent with the first write-pointer assignment phase of a next write-pointer assignment period, and in which the read pointer stepwise traverses respective current pointer values in the first rotation direction, having a pointer-value offset of one step in the first rotation direction over the write pointer.

In this embodiment, the buffer-control unit provides writing and reading access to the circular-buffer memory, which effectively minimizes the latency between writing to the buffer and reading from the buffer. Also, the size of the circular buffer memory can be kept small by coordinating the write-pointer assignment and read-pointer assignment phases. As a result, the reading access is only one pointer assignment phase behind the writing. The present embodiment coordinates read-pointer assignment phases and write-pointer assignment phases, such that they can be performed concurrently with only a small latency between writing and reading a particular data structure. As will be explained in detail with reference to the figures further below, the latency between reading and writing varies to some extent due to the meandering scan order, with which the input data structures are provided. Access conflicts, in which reading and writing requests are directed to the same memory location, are avoided by the specific coordination of read-and-write-pointer assignment phases.

In a further embodiment, the buffer control unit is adapted to maintain a pointer-allocation table, which allocates to each index pair corresponding to a data structure currently stored in the circular-buffer memory the respective pointer value, which was assigned to the index pair as the write-pointer value, look up the respective pointer value allocated to a respective index pair contained in a current read request in the pointer-allocation table, direct the read request to the memory location having the respective pointer value, provide the data structure stored in the respective memory location to the second processing section.

The present embodiment makes use of a pointer-allocation table, which is used to look up the pointer of memory location for a particular data structure of the two-dimensional array, which can be identified in the read request by its index values. This embodiment is useful where the size of the circular buffer can be kept small, allowing a fast look-up of the pointer of the memory location as compared to the time needed for recomputing the buffer address.

According to a second aspect of the invention, a data processing device is provided, comprising a first processing unit adapted to provide a two-dimensional array of data structures organized by two indices, each index taking on index values from a respective ordered index-value set, wherein with each provided data structure a first index stepwise traverses first-index values from a first index-value set in a meandering manner defined by a first and a second meandering direction, and, connected to the first processing unit. The data processing device of the invention comprises a data buffering device according to the first aspect to the invention or according to one of the embodiments of the data buffering device described herein.

The data processing device of the second aspect of the invention has a first processing unit providing data structures, which form a two-dimensional array in a meandering manner. The use of the data buffering device of the first aspect of the invention in the data processing device allows to minimize the chip area in a hardware implementation. This follows from the explanation set forth above, according to which the use of a circular buffer allows to keep the buffer space small.

In the following, preferred embodiments of the data processing device of the invention will be set forth.

The data processing device of the invention allows to achieve a particularly small latency in communication with a second processing unit, which reads the buffered data structures in a non-meandering manner. According to a first preferred embodiment, the data processing device thus has a second processing unit, which is connected to the data buffering device and adapted to sequentially provide read requests to the circular-buffer memory for data structures of the two-dimensional array according to a non-meandering read pattern, such that the first index repeatedly traverses the first index-value set in a fixed read direction. The second processing unit can be integrated with the first processing unit into a single hardware device. Of course, the invention works also with processing units that are physically separated from each other.

Generally, the term "processing unit" as used herein is to be understood in a purely functional way. A processing unit may take the form of a circuit section, an application specific integrated circuit (ASIC), such as in the form of a microchip, a suitable combination of microchips, such as in a computer, or an array of computers. A processing device according to the invention comprises the first processing unit. Keeping that limitation in mind, a processing device may as well take any one of the forms mentioned above an implementation of a processing unit.

In a currently most preferred embodiment, in the data processing device of the invention the first processing unit is adapted to perform a motion estimation algorithm, sequentially providing to the circular buffer memory a two-dimensional array of motion vectors allocated to a corresponding two-dimensional array of pixel-data blocks, which form sub-arrays of a video image. The present embodiment allows to implement recent motion estimation algorithms in the first processing unit, which output vectors in a meandering scan order, while keeping the latency and the processing complexity low.

In one embodiment, the first processing unit implementing a motion estimator is adapted to provide the two-dimensional array of motion vectors in a horizontally meandering order, traversing a first line of the array in a first meandering direction, a following line of the array in the second meandering direction, a next following line in the first meandering direction, and so forth.

Most preferably, the second processing unit is adapted to perform a motion compensation algorithm and to sequentially read the two-dimensional array of motion vectors from the circular buffer memory. The data processing device of this embodiment can be included in a efficient high-quality picture-rate up-converter. In such an up-converter, the first processing unit implementing a motion estimator and the second processing unit implementing a motion compensator can be included in a single ASIC.

A further preferred embodiment of the data processing device of the invention comprises a low-level cache memory connected to the first processing unit and adapted to hold a current sliding search area, which is allocated to a respective pixel-block and forms a subarray of the complete two-dimensional array of pixel-data blocks, which forms a video frame. In block-based motion estimation algorithms, a search area of defined extensions around each currently processed pixel-block is used for ascertaining a motion vector for the currently pixel block. When the motion estimation starts processing a next pixel-block, the search area is updated in that certain pixel-blocks are overwritten according to a replacement scheme which is adapted to the meandering scan order of the motion estimation algorithm. Preferably, in the present embodiment a cache controller connected to the low-level cache memory is adapted to load the pixel-data blocks required to maintain the search area updated for a respective currently processed pixel block into the low-level cache memory.

This embodiment allows to reduce the access frequency to a main memory. Therefore, by introducing the low-level cache memory the bandwidth requirements of data communication between a frame memory and the processing unit are reduced. Since a low-level cache memory is typically located on the same chip as the motion estimator, while the frame memory is typically not, the latency of a access to the pixel-blocks required by the motion estimator is reduced.

The above effects can be further enhanced by introducing a high-level cache memory, which is connected between the low-level cache memory and is connectable to an external memory containing at least the currently processed video frame. The high-level cache memory is larger in capacity than the low-level cache memory. It is adapted to hold a region of the two-dimensional array of pixel-data blocks extending over a number of consecutive sliding search areas. Preferably, the cache control unit is adapted to control the fetch operation of the pixel-data blocks required to maintain the region updated.

Preferably, the cache controller allows access to the high-level cache memory to both processing units, i.e., the motion estimator and the motion compensator. In prior art devices, a rather large capacity overhead of the high-level cache memory was necessary to accommodate the different scan orders of a meandering motion estimator and a non-meandering motion compensator. In contrast, by incorporation of the data buffering device of the first aspect of the invention, the required capacity of the high-level cache memory can be reduced.

For example, the circular-buffer size for motion vectors derived from 1 pixel-block line plus 1 pixel block is the minimum for accommodating different scanning types of motion estimation (ME) and motion compensation (MC). This implies that the size of the high-level cache memory for video data shared between ME and MC is also minimized. The high-level cache memory at least needs to hold several block-lines of video data to address the search area height (typically 5 block-lines for SD sequences). Thus, the overhead memory capacity needed to address different scanning directions of ME and MC is one pixel-block line plus one pixel block. In the given example of a SD video sequence, only 7 block-lines are needed for the shared high-level cache memory.

In a further preferred embodiment, which is combined with the motion estimator performing a horizontally meandering scan, the second processing unit is adapted to read the two-dimensional array of motion vectors line-by-line, and each line from left to right.

According to third aspect of the invention, a data buffering method is provided, comprising the steps of receiving a two-dimensional array of data structures organized by two indices, each index taking on index values from a respective ordered index-value set, wherein with each provided data structure a first index stepwise traverses first-index values from a first index-value set in a meandering manner defined by a first and a second meandering direction, the data processing method comprising the steps of sequentially storing the data structures provided by the first process to a circular buffer memory having a predetermined number of memory locations addressable by means of an ordered set of pointer values, assigning, in a periodical manner, a write-pointer value from the pointer-value set to an index pair of a current data structure provided by the first process, one write-pointer assignment period having a first write-pointer assignment phase, during which the first index stepwise traverses the first index-value set in the first meandering direction, and the write pointer stepwise traverses respective current pointer values in a first rotation direction defined within the pointer-value set, a second write-pointer assignment phase, during which the first index value changes in the second meandering direction, and the write pointer stepwise traverses respective current pointer values in the first rotation direction, a third write-pointer assignment phase, during which the first index stepwise traverses the first index-value set in the first meandering direction, and the write pointer stepwise traverses respective current pointer values in a second rotation direction opposite to the first rotation direction, and a fourth write-pointer assignment phase, during which the first index value changes in the second meandering direction, and the write pointer value stepwise traverses respective current pointer values in the second rotation direction.

The data buffering method of the third aspect of the invention comprises method steps performed by the data buffering device of the first aspect of the invention. To keep the present description concise, reference is made to the above description of the data buffering device for a detailed explanation of the advantages of the method and its advantages. Also, terms used for the definition of the method of the third aspect of the invention are to be interpreted as set forth in the context of the description of the data buffering device of the first aspect of the invention.

According to a fourth aspect of the invention, a data processing method is provided, wherein a first process provides a two-dimensional array of data structures organized by two indices, each index taking on index values from a respective ordered index-value set, wherein with each provided data structure a first index stepwise traverses first-index values from a first index-value set in a meandering manner defined by a first and a second meandering direction. In the data processing method of the fourth aspect of the invention, a data buffering method according to the third aspect of the invention is performed.

The data processing method of the fourth aspect of the invention comprises the method steps performed by a data processing device according to the second aspect of the invention. Again, reference is made to the above description.

In the following preferred embodiments of the data processing method will be mentioned. The advantages of these embodiments are those set forth with the description of corresponding embodiments of the data processing device of the second aspect of the invention.

In a further embodiment of the data processing method of the invention a second process sequentially provides read requests to the circular-buffer memory for data structures of the two-dimensional array according to a non-meandering read pattern, such that the first index repeatedly traverses the first index-value set in a fixed read direction.

In a further embodiment of the data processing method of the invention the number of addressable memory locations of the circular-buffer memory exceeds the number of first-index values by one, and comprising the steps of assigning to an index pair of a current incoming read request to the data buffer a read-pointer value from the pointer-value set in a periodical manner, one read-pointer-assignment period having a first read-pointer assignment phase, which is concurrent with the second write-pointer assignment phase, and in which the read pointer stepwise traverses respective current pointer values in the first rotation direction, having a pointer-value offset of one step in the first rotation direction over the write pointer, and changing from the first to the second rotation direction in the last assigning step, a second read-pointer assignment phase, which is concurrent with the third write-pointer assignment phase, and in which the read pointer stepwise traverses respective current pointer values in the second rotation direction, having a pointer-value offset of one step in the second rotation direction over the write pointer, a third read-pointer assignment phase, which is concurrent with the fourth write-pointer assignment phase, and in which the read pointer stepwise traverses respective current pointer values in the second rotation direction, having a pointer-value offset of one step in the second rotation direction over the write pointer, and changing from the second to the first rotation direction in the last assigning step, and a fourth read-pointer assignment phase, which is concurrent with the first write-pointer assignment phase of a next write-pointer assignment period, and in which the read pointer stepwise traverses respective current pointer values in the first rotation direction, having a pointer-value offset of one step in the first rotation direction over the write pointer.

A further embodiment of the data processing method of the invention comprises the steps of maintaining a pointer-allocation table, which allocates to each index pair corresponding to a data structure currently stored in the circular-buffer memory the respective pointer value, which was assigned to the index pair as the write-pointer value, look up the respective pointer value allocated to a respective index pair contained in a current read request in the pointer-allocation table, direct the read request to the memory location having the respective pointer value, provide the data structure stored in the respective memory location to the second processing section.

In a further embodiment of the data processing method of the invention the first process is a motion estimation algorithm, sequentially providing to the circular buffer memory a two-dimensional array of motion vectors allocated to a corresponding two-dimensional array of pixel-data blocks, which form subarrays of a video image.

In a further embodiment of the data processing method of the invention the first processing unit is adapted to provide the two-dimensional array of motion vectors in a horizontally meandering order, traversing a first line of the array in a first meandering direction, a following line of the array in the second meandering direction, a next following line in the first meandering direction, and so forth.

In a further embodiment of the data processing method of the invention the second process is adapted to perform a motion compensation algorithm and to sequentially read the two-dimensional array of motion vectors from the circular buffer memory.

In a further embodiment of the data processing method of the invention the second process reads the two-dimensional array of motion vectors line-by-line, and each line from left to right.

In the following, further embodiments will be explained with reference to the figures.

Figure 1:
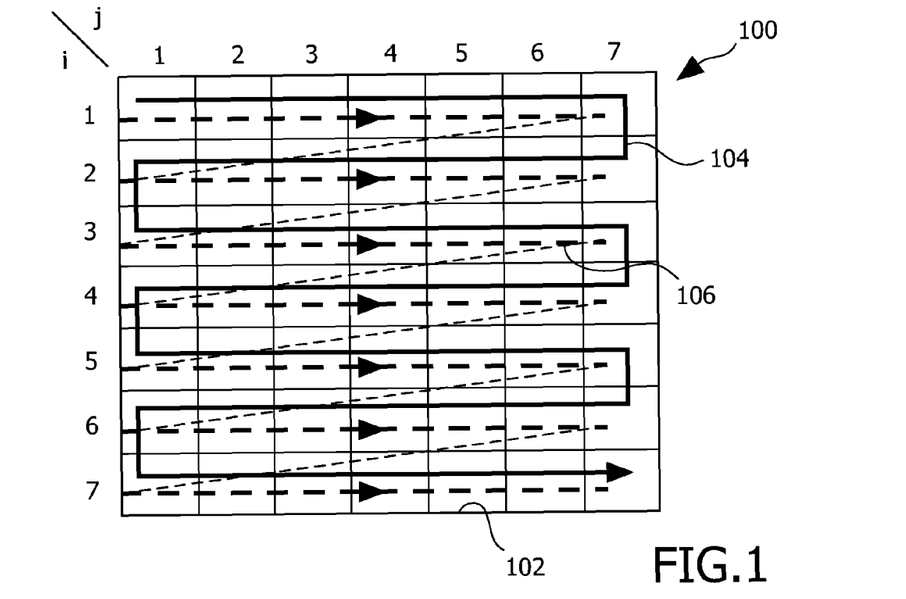
FIG. 1 shows a video frame for visualizing a first example of different scan orders applied by two different processing algorithms.

FIG. 1 shows a video frame 100. As is well known in the art, an image or video frame can be represented by a two-dimensional array of pixel data. The pixel data typically define the contribution of three colors to a light intensity, which for example is to be emitted by a display device when the pixel is displayed on a screen. The pixel data is organized by the values of an index pair, as is well known for matrix-like two-dimensional arrays of data structures. For the purposes of the present embodiment, the pixels of video frame 100 are grouped into pixel blocks, as is indicated by a grid partitioning the video frame into pixel blocks that form two-dimensional sub-arrays of the video frame. One example of a pixel block is indicated by reference number 102. For the purposes of the following description, the pixel blocks of video frame 100 will be identified by a pair of indices (i, j), which are shown along the left and top borders of video frame 100. As can be seen, video frame 100 contains seven pixel-block lines and seven pixel-block columns.

A full arrow line 104, which traverses the pixel blocks of video frame 100 in a meandering pattern, represents a scan order of a first video processing algorithm. The first processing algorithm, which is implemented in a processing unit, provides a data structure at its output, which is allocated to a currently processed pixel block. The first video processing algorithm may be a motion estimation algorithm, providing a motion vector for each processed pixel block. As can be seen from the meandering pattern of arrow line 104, the first video processing algorithm processes the first pixel-block line from pixel blocks (1, 1) to pixel block (1, 7), i.e., from left to right. Then the second pixel-block line is processed from pixel block (2, 7) to pixel block (2, 1), i.e., from right to left. The scan order followed in the first two pixel-block lines is periodically repeated and ends with pixel-block line i=7 being processed from left to right. A next video frame will be processed according to the same pattern, again starting at pixel block (1, 1) and processing the first pixel-block line from left to right.

Also shown in FIG. 1 is a dashed arrow line 106, which represents the scan order followed by a second data processing algorithm, such as a motion compensation algorithm. The second data processing algorithm reads the output of the first data processing algorithm for generating an output. However, the scan order followed by motion compensation algorithm differs from that of the motion estimation algorithm. All pixel-block lines i=1, 2, . . . , 7 are processed from left to right. After completing the processing of a current pixel-block line at the rightmost pixel block (i, 7), the motion compensation algorithm continues with the leftmost pixel block (i+1, 1) of the following pixel-block line.

The different scan orders of the motion estimation and motion compensation algorithms introduce a variable delay between providing a motion vector for a particular pixel block and processing the motion vector for the purposes of motion compensation. This requires buffering the motion vectors provided by the motion estimation algorithm for a certain time.

Figure 2:
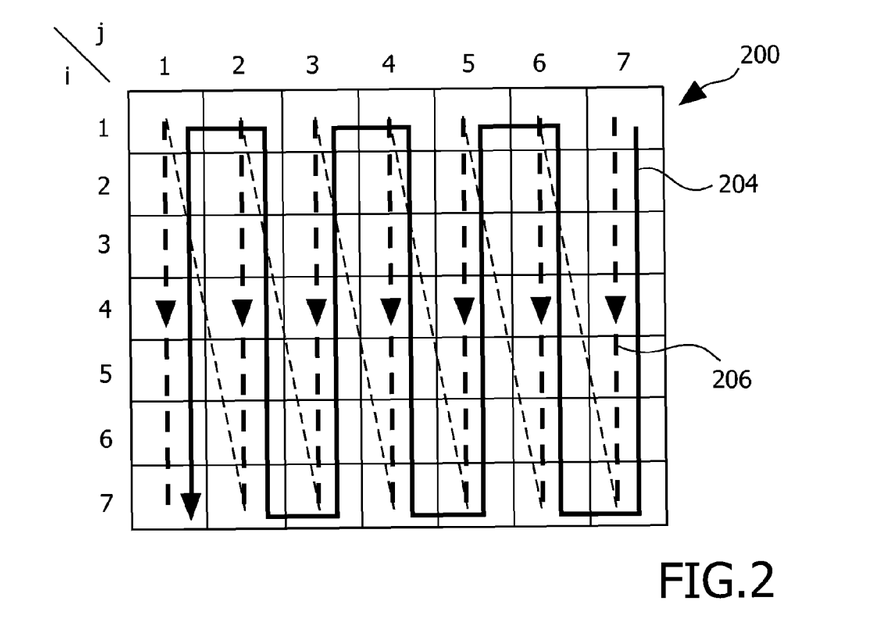
FIG. 2 shows a video frame visualizing a second example of different scan orders applied by two different processing algorithms.

The scan orders indicated by arrow lines 104 and 106 serve as an example. Further combinations of scan orders of the first and second data processing algorithms are possible. A second example is shown in FIG. 2. The graphical representation of a video frame 200 corresponds to that of video frame 100 of FIG. 1. A full arrow line 204 indicates the scan order followed by the first data processing algorithm. The processing starts with pixel block (1, 7) and follows the rightmost column (i, 7) from top to bottom. After processing pixel block (7, 7), processing continues in pixel-block column (i, 6) with the bottom pixel block (7, 6) and follows that column to the top pixel block (1, 6). This scan pattern is periodically repeated until all pixel blocks of video frame 200 have been processed. A second arrow line 206 indicates the scan order followed by the second data processing algorithm. Again, the second data processing algorithm depends on reading the output of the first data processing algorithm. The second processing algorithm also starts with pixel block (1, 7) and follows that pixel-block column down to block (7, 7). The second data processing algorithm then continues by processing the neighboring column (i, 6) from top to bottom. Thus, all pixel-block columns are processed from top to bottom until the complete video frame has been processed.

It becomes apparent from the description of FIGS. 1 and 2 that other combinations of scan orders followed by two data processing algorithms working on a video frame are possible. For instance, the example shown in FIG. 1 could be modified such that the first data processing algorithm starts in the bottom line with the right most pixel-block (7, 7) and follows a meandering pattern through all pixel blocks of video frame 100. The second data processing algorithm, which uses the output of the first data processing algorithm, also starts with pixel block (7, 7) and follows the scan order of the first data processing algorithm in the first pixel-block line or -column, maintaining this scan order for the following pixel-block lines or -columns.

With reference to FIGS. 1 and 3 to 5 in parallel, an embodiment of the data buffering method and device of the invention will now be explained. For the following description, it will again be assumed that a motion estimator (ME) processes video frame 100, and sequentially provides data structures in the form of motion vectors for temporal storage by means of the data buffering method and device of the invention. The scan order of the motion estimator corresponds to that indicated by arrow line 104 of FIG. 1. Further, it will be assumed that a motion compensator (MC) reads the motion vectors from the data buffering device. The scan order of the motion compensator corresponds to that indicated by arrow line 106 in FIG. 1. It is noted that the data buffering method and device of the invention can be operated independently from the particular nature of the first and second data processing devices or algorithms.

Figure 3:
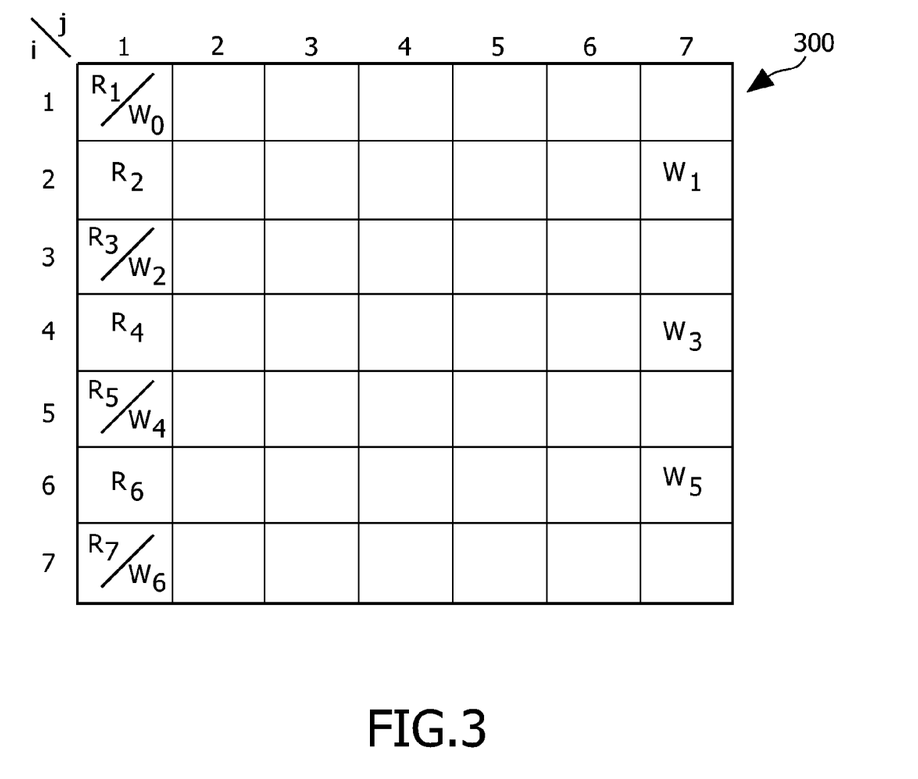
FIG. 3 shows a video frame visualizing a first embodiment of a data buffering method and of a data processing method.
Figure 4A:
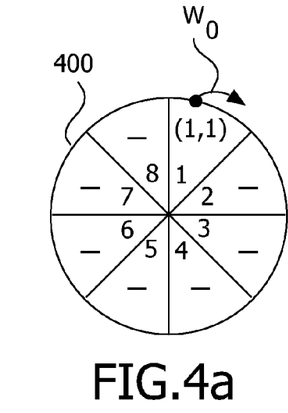
FIG. 4a)-h) show different operation stages of a circular buffer in the data buffering and data processing method of FIG. 3.

FIG. 3 represents a matrix 300. The structure of matrix 300 corresponds to that of video frame 100 of FIG. 1. The matrix 300 is only used for the purpose of visualization in the present description. FIG. 4a) to 4h) show a circular buffer 400 at different points in time during the processing of video frame 100. FIG. 5a) to 5h) show the movement of write pointers (FIGS. 5a), c), e), g)) and read pointers (FIGS. 5b), d), f), h)) between different operation stages of circular buffer 400, corresponding to different operation stages in relation to video frame 100.

Matrix 300 of FIG. 3 serves to visualize the scanning process of the ME and MC algorithms in the video frame 100 at different operation stages, according to the scanning orders shown by arrow lines 104 and 106. A number of matrix cells in matrix 300 is marked by entries of the type $R_n$, $W_m$, or $R_n/W_m$. These entries indicate write (W)- or read (R)-operations performed at different operation stages of the buffer device during the processing of video frame 100. A particular operation stage is indicated by the subscript index m or n, respectively. The higher the subscript index is the later is the corresponding operation stage. The arrangement of a particular entry $W_m$ or $R_n$ in a particular matrix cell (i, j) indicates that a motion vector allocated to the pixel block having the same index pair (i, j) as the matrix cell is written (W) to the circular buffer 400 or read (R) from the circular buffer 400 at the operation stage given by the subscript index m or n. The entries $W_m$ and $R_m$ are also used in FIGS. 4 and 5 as reference signs to write-pointer and read-pointer values at corresponding stages of operation.

Equal indices m and n indicate that read- and write operations or respective pointer allocation steps are performed at the same stage of operation. It is noted that write- and read operations performed at the same stage of operation, i.e., concurrently, need not literally be performed at the same point in time. Rather, a operation stage can also span a certain time interval, during which one write and one read operation are performed at different points in time. The order of read- and write operations during one operation stage of the circular buffer is not critical. However, in the present embodiment of the invention, one read operation $R_x$ and one write operation $W_x$ at the same operation stage x are both performed before a next write operation $W_{x+1}$ takes place, thus preventing that a memory cell is overwritten before it has been read.

The motion estimator provides motion vectors of a given bit size for temporal storage in circular buffer 400. Circular buffer 400 has 8 memory locations, each represented by a section of the circular buffer 400 and marked with a corresponding address 1, 2, 3, . . . , 8. Each memory location has a storage capacity for one motion vector. The number of 8 memory locations is chosen here, because there are 7 motion vectors provided for each pixel-block line. Generally, the number of memory locations of the circular buffer preferably exceeds the number of pixel-blocks processed by the motion estimator per half a meandering period by one. This way, overwriting of memory locations before read out is avoided while keeping the buffer size as small as possible. Additional memory locations are optional, but not necessary. Their addition would require a different pointer allocation pattern compared to that described here.

In FIGS. 4 and 5, small full circles are drawn into respective memory locations and represent a pointer position at a particular operation stage, which can be identified by the reference sign used in accordance with FIG. 3. In FIG. 5, the pointers are connected by spiraling arrow lines 502 to 516 to visualize the rotational movement of pointer allocation along the memory locations of the circular buffer 400.

FIG. 4a) to h) show, distributed over the memory locations of the circular buffer 400, the index pairs identifying respective motion vectors being currently stored in the memory locations 1 to 8 and respective current read- and write-pointer values. It is noted that the read- and write operation stages indicated in respective matrix cells of FIG. 3 and the different phases of pointer allocation and, thus, buffer operation shown in FIG. 4a) to h) correspond to each other.

FIG. 4a) shows the state of the circular buffer 400 at a first operation stage. The motion vector (1,1) provided by the ME algorithm after processing pixel block (1, 1) of video frame 100 is stored at memory location 1. The other memory locations 2 to 7 have not been used at this stage. Also, no reading access is performed before the first line of motion vectors is complete. A write-pointer $W_0$ is symbolized by a full circle drawn on the outer edge of memory location 1. Generally, the position of a full circle marked by a reference sign $W_m$ indicates that a write pointer currently points to the corresponding memory cell, the current operation stage being indicated by the index m. The full circles symbolizing pointer positions are each connected to an arrow pointing in one of two possible directions along the outline of the circle representing circular buffer 400. These arrows indicate, to which memory cell the buffer-control unit of circular buffer 400 will assign the next write pointer. The rotation direction of pointer assignment can be either clockwise or counterclockwise with respect to the memory locations of the circular buffer, or, in other words toward higher or lower address values. According to the present invention, the direction of pointer assignment changes at well defined operation stages, as will be described below.

Figure 4B:
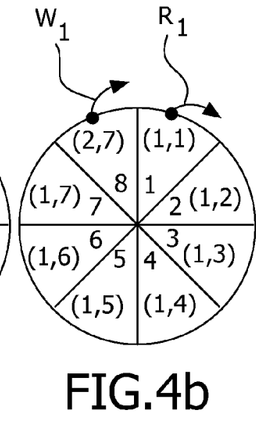
Figure 5A:
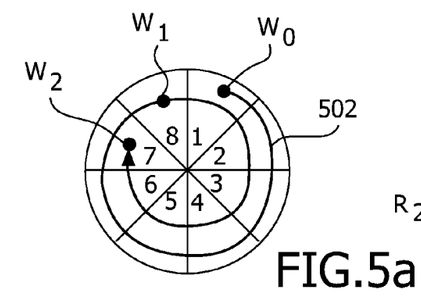
FIG. 5a)-h) visualize the periodical nature of write-pointer and read-pointer assignment in the embodiment of FIGS. 3 and 4.

FIG. 4b) shows the current state of circular buffer 400 at a second operation stage. Write pointer $W_1$ is shown to point to memory location 8. The motion estimator has finished processing the first pixel-block line, and now provides the first motion vector of the second pixel-block line, which is allocated to pixel block (2,7). Circular buffer 400 holds the complete first line of motion vectors in memory locations 1 to 7. As can be seen from FIG. 5a), the clockwise rotation of the write pointer assignment has continued through the second operation stage. A read pointer $R_1$ is shown at memory location 1. At this second operation stage, the MC algorithm starts reading the first line of motion vectors starting with the index pair (1, 1), cf. FIGS. 1 and 3. Both pointers will be rotated clockwise in the processing steps to follow.

FIG. 5a) shows the clockwise rotation of the write pointer from its initial position $W_0$ at memory location 1 to the position $W_1$ at memory location 8, summarizing the operation stages between those shown in FIGS. 4a), 4b), and 4c). The write-pointer assignment continues in clockwise direction until reaching memory location 7 (pointer $W_2$) a second time. At this processing stage, shown, in FIG. 4c) the motion estimation process has finished processing the second pixel-block line of video frame 300, processing and storing the motion vector of pixel-block (3,1), and has started a second period of the meandering scan order. At the same time, the motion compensator has finished processing the motion vectors corresponding to the first pixel-block line (i=1) and reads and processes pixel block (2, 1).

Figure 5B:
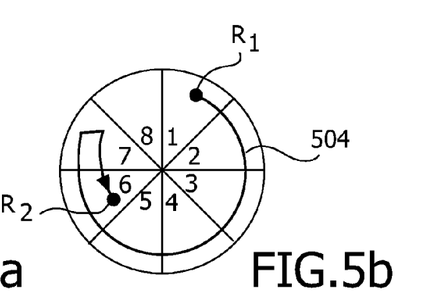
Figure 5C:
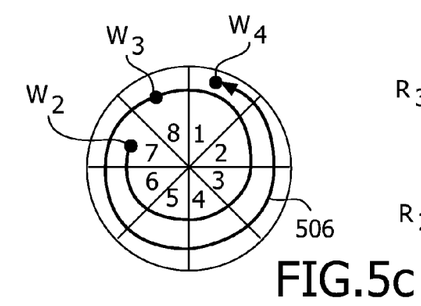
Figure 5D:
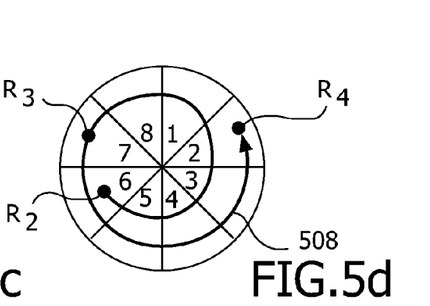
Figure 5E:
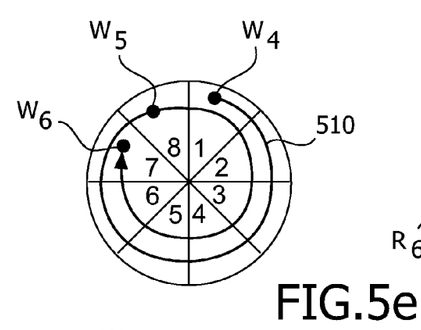
Figure 5F:
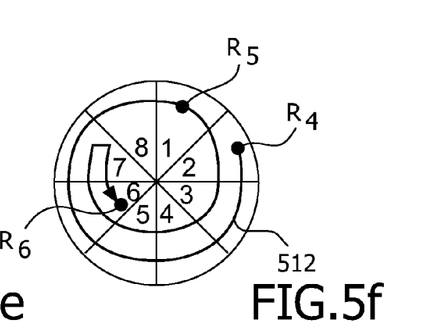
Figure 5G:
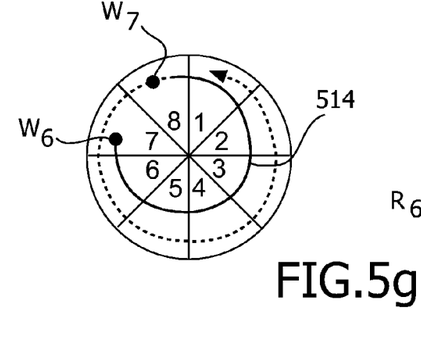
Figure 5H:
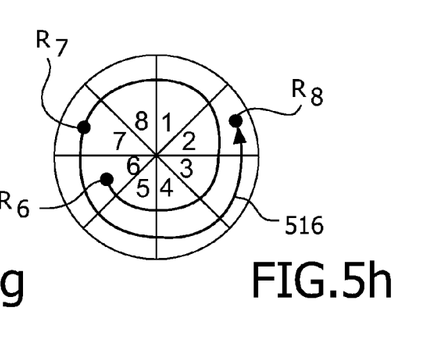

As can be seen from a comparison of FIGS. 5a) and b) the read pointer is initially one memory location ahead of the write pointer in its clockwise rotational movement along the memory cells.

Figure 4C:
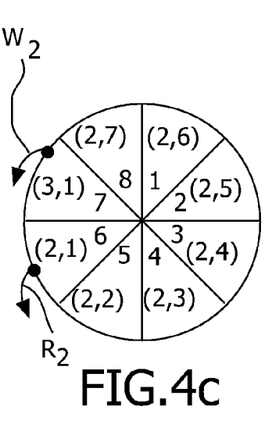

At memory cell 7 the read pointer changes the rotation direction, proceeding to memory location 6 with the next step, as shown by read pointer $R_2$ in FIG. 5b), to continue with reading the motion vectors obtained from the pixel-block line i=2 in memory locations 6, 5, 4, 3, 2, 1, and 8, cf. FIG. 4c). With this step, the write and read pointers cross each other in their rotational movement, thus allowing to immediately overwrite memory cell 7 with the motion vector calculated from pixel block (3, 1) after the motion compensator has read the motion vector of pixel block (1, 7) from the same memory location.

Figure 4D:
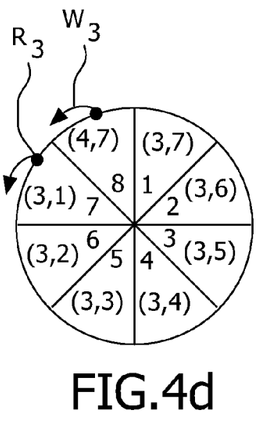
Figure 4E:
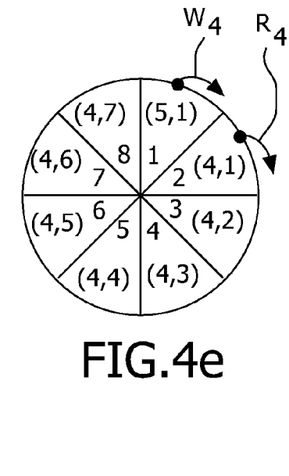
Figure 4F:
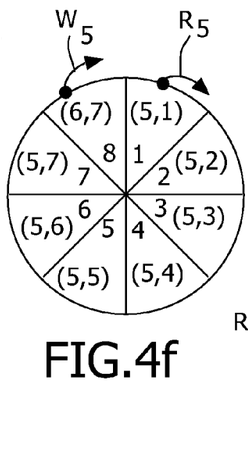
Figure 4G:
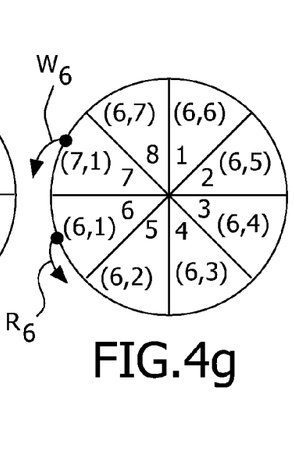
Figure 4H:
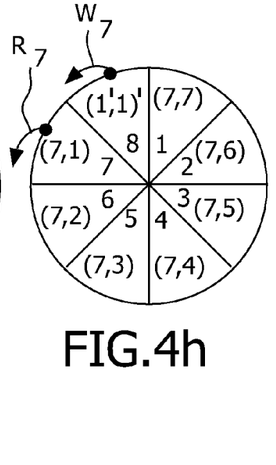

Four write-pointer assignment phases can thus be identified:

a) A first write-pointer assignment phase ($W_0$ to $W_1$), during which the line index of the provided motion vectors stepwise traverses a matrix line of matrix 300 from left to right. Concurrently, the write pointer stepwise traverses pointer values in clockwise direction. This phase is shown in FIGS. 4a) and 4b), and in FIG. 5a). This phase is again passed in a second write pointer assignment period at a later stage, as shown in FIGS. 4e) and 4f), and FIG. 5e).

b) A second write-pointer assignment phase ($W_1$ to $W_2$), during which the line index of the provided motion vectors stepwise traverses a next matrix line from right to left. Concurrently, the write pointer stepwise traverses pointer values in clockwise rotation direction. This phase is shown in FIGS. 4b) and 4c), and in FIG. 5a). This phase is in part again passed in a second write pointer assignment period, as shown in FIGS. 4g) and 4h), and in FIG. 5g).

c) A third write-pointer assignment phase ($W_2$ to $W_3$), during which the line index of the provided motion vectors stepwise traverses a next matrix line from left to right. Concurrently, the write pointer stepwise traverses pointer values in counter-clockwise direction. This phase is shown in FIGS. 4c) and 4d), and in FIG. 5c).

d) A fourth write-pointer assignment phase ($W_3$ to $W_4$), during which the line index of the provided motion vectors traverses a next matrix line from right to left. Concurrently, the write pointer value stepwise traverses pointer values counter-clockwise direction. This phase is shown in FIGS. 4d) and 4e), and in FIG. 5c).

One complete write pointer assignment phase is passed between pointers $W_0$ and $W_4$.

Concurrently, four read-pointer-assignment phases take place, which can be identified as follows:

e) A first read-pointer assignment phase ($R_1$ to $R_2$), which is concurrent with the second write-pointer assignment phase ($W_1$ to $W_2$), and in which the read pointer stepwise traverses respective current pointer values clockwise direction, having a pointer-value offset of one step in the clockwise direction over the write pointer, and changing from the first to the second rotation direction in the last assigning step. This phase is shown in FIGS. 4b) and 4c), and in FIG. 5b).

f) A second read-pointer assignment phase ($R_2$ to $R_3$), which is concurrent with the third write-pointer assignment phase ($W_2$ to $W_3$), and in which the read pointer stepwise traverses respective current pointer values in counter-clockwise direction, having a pointer-value offset of one step counter-clockwise rotation direction over the write pointer. This phase is shown in FIGS. 4c) and 4d), and in FIG. 5d).

g) A third read-pointer assignment phase ($R_3$ to $R_4$), which is concurrent with the fourth write-pointer assignment phase ($W_3$ to $W_4$), and in which the read pointer stepwise traverses respective current pointer values in counter-clockwise rotation direction, having a pointer-value offset of one step in counter-clockwise rotation direction over the write pointer, and changing from to the clockwise rotation direction in the last assigning step. This phase is shown in FIGS. 4d) and 4e), and in FIG. 5f).

h) A fourth read-pointer assignment phase ($R_4$ to $R_5$), which is concurrent with the first write-pointer assignment phase of a next write-pointer assignment period ($W_4$ to $W_5$), and in which the read pointer stepwise traverses respective current pointer values in clockwise rotation direction, having a pointer-value offset of one step in clockwise rotation direction over the write pointer.

When the last motion vector of an image has been written the final read-pointer assignment phase is preferably concurrent to a first write-pointer assignment phase for a next image. That is, the pointer assignment procedure is continued with the beginning of a new image. Alternatively, a reset can be performed such that the assignment starts with identical pointers for all images of a video sequence. However, the continuous assignment over several images is simpler and thus faster than introducing a reset.

Figure 6:
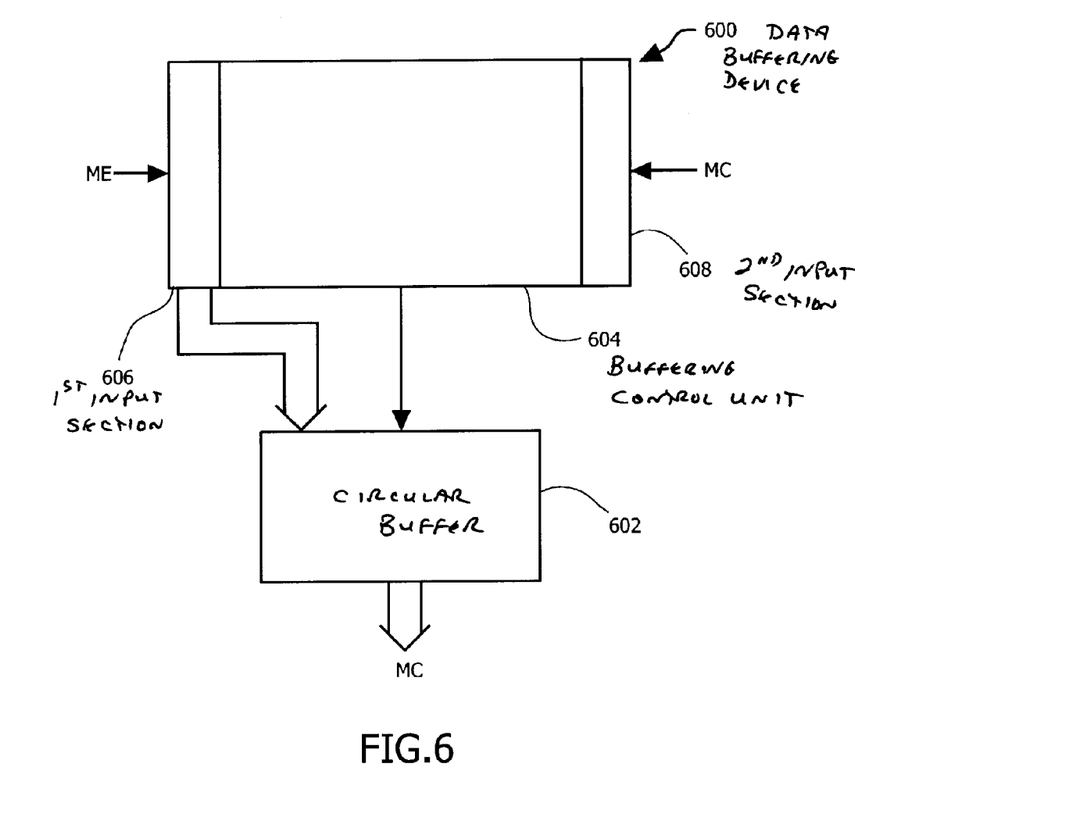
FIG. 6 shows a block diagram of an embodiment of the data buffering device of the invention.

FIG. 6 shows a block diagram of an embodiment of a data buffering device 600 according to the invention. The data buffering device has a circular buffer 602 and a buffer-control unit 604. A first input section 606 is adapted to sequentially receive write requests for storing a two-dimensional array of data structures from an external first processing unit, which by way of example is assumed to be a motion estimator ME. A second input section 608 is adapted to receive read requests for data structures stored in circular buffer 602 from a second external processing unit, which by way of example is assumed to be a motion compensator MC.

The write and read requests may be received with or without index values from the external processing units. In one embodiment, an index pair is provided with a write request, and input section 606 is adapted to separately forward the index values to the buffer-control unit 604, and the actual data structure value to the circular buffer 602. In case no index pair is provided by the motion estimator, the input unit 606 is additionally adapted to generate an appropriate index pair for internal use by the buffer-control unit 608. This second alternative is used in a constellation, in which the scan order and pixel-block structure of a processed video frame are predefined, so that the input unit knows which index values to assign to an incoming data structure according to a predefined assignment rule.

The buffer-control unit 604 controls write access and read access to the circular buffer 602. It receives index values from input units 604 and 606. Depending on the current values of the index pair (i, j) of an incoming data structure for a write request or a read request the buffer-control unit performs the periodical write-pointer and read-pointer assignment having the four respective pointer assignment phases according to the general method set forth above. The pointer assignment method can be implemented in hardware or software.

Based on an assigned write-pointer, the buffer-control unit 604 addresses a corresponding memory location of buffer memory 602 and stores the received motion vector under that location. In case of a read request, the buffer-control unit 604 addresses the corresponding memory location of buffer memory 602 after assigning the current read-pointer value.

In one embodiment, buffer memory 602 forms a section of a larger memory. A number of memory locations can be allocated for the circular buffer memory, depending on the number of data structures to be received per half meandering period of the two-dimensional array. Also, the size of the memory locations may be variable in dependence on the bit size of the individual data structures. Buffer-control unit 604 is adapted to ascertain and allocate the number of memory locations necessary for performing the coordinated write- and read-pointer assignment according to the embodiment of the invention described above, and to manage an appropriate number of pointers. Buffer-control unit 604 may also be adaptable to different scan orders used by the first and second processing units.

Figure 7:
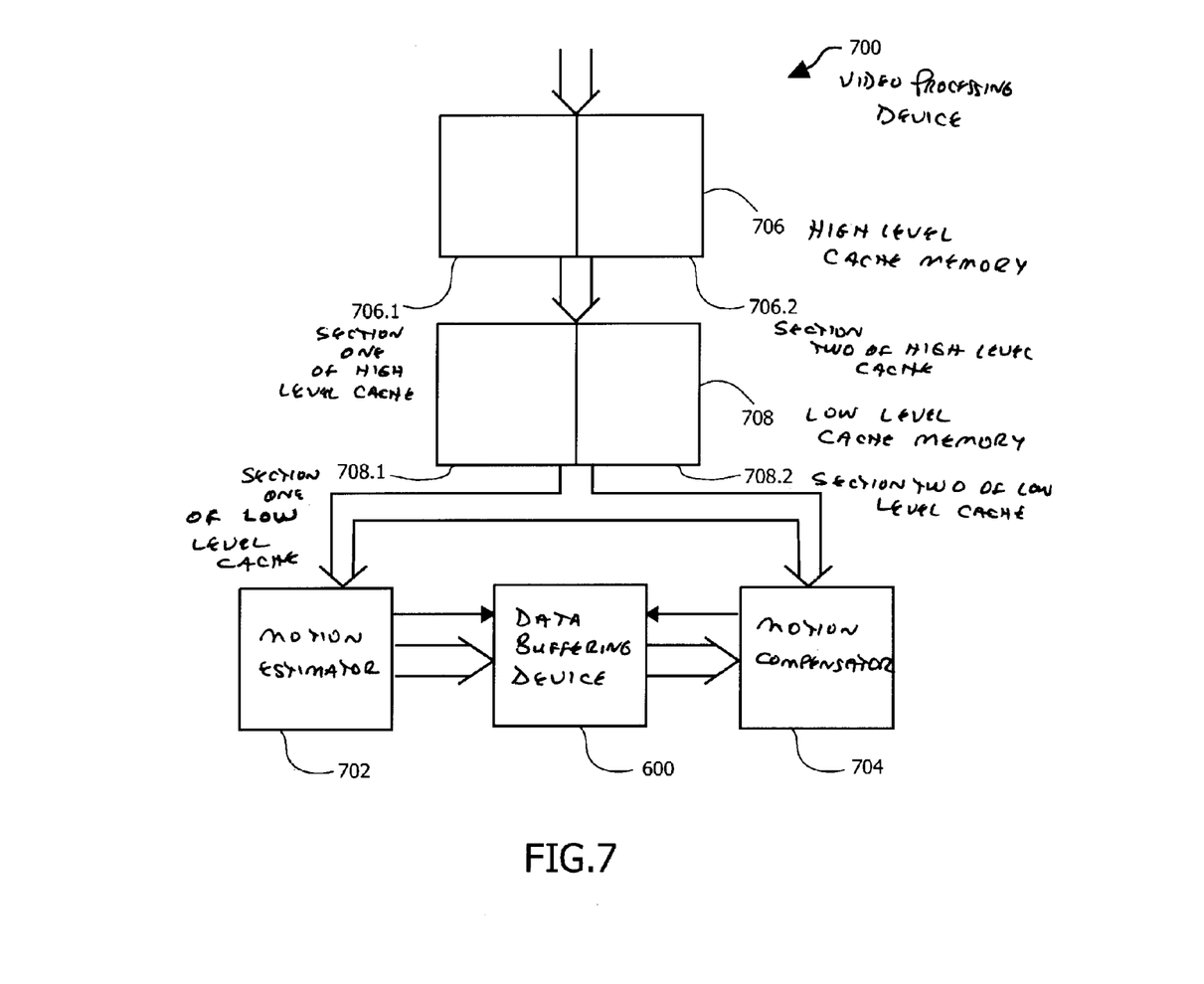
FIG. 7 shows a block diagram of an embodiment of the data processing device of the invention.

FIG. 7 shows a simplified block diagram of a video processing device 700 forming an embodiment of the data processing device of the invention. The video processing device 700 is a picture-rate up-converter, and will be referred to in short as an up-converter in the following. Such devices are for instance used in the field of consumer electronics for converting different video scanning formats into each other for display by a television (TV) set, as set forth in the introductory section of the present specification. By way of example, an up-converter may create intermediate fields containing additional movement phases between fields of a TV transmission of 50 fields per second for a TV set supporting a field rate of 100 fields per second.

The block diagram of FIG. 7 shows only functional blocks of video processing device 700, which are related to the present invention. Typically, the video processing device 700 is implemented in hardware, for instance on silicon as an integrated circuit. A software implementation is also possible, but slow in performance and therefore not preferred for use in consumer electronics devices.

Two processing units are provided, a motion estimator 702 and a motion compensator 704. Motion estimator 702 performs a motion estimation algorithm. Motion estimation algorithms are known in the art. Motion estimator 702 is adapted to perform a block-matching algorithm, which divides an image into pixel-blocks and assigns to every pixel-block a motion vector. Preferably, a well-known three-dimensional recursive search (3DRS) algorithm is used.

Pixel-blocks of two successive images, fields or video frames are obtained from an external memory through a high-level (L1) cache memory 706 and a low-level (L0) cache memory 708, each containing two sections 706.1, 706.2, and 708.1, 708.2 for a respective one of the successive images. A L0 cache memory 708 holds a complete sliding search area of each of the two successive images, each search area forming a subarray of the respective image and surrounding a currently processed pixel-block. The content of L0 cache memory 708 is updated with every processed pixel-block through L1 cache memory 706, which typically holds a region of each of the successive images, a region containing several pixel-block lines and covering a number of consecutive search areas.

Motion estimator 702 provides motion vectors at its output according to a meandering scan order, as explained earlier with reference to FIGS. 1 to 5. The motion vectors are buffered in data buffer 600, which was described in closer detail with reference to FIG. 6. Motion compensator 704 reads motion vectors from the data buffer 600 for generating intermediate images.

For video sequences having the Standard Definition (SD) format, the search area typically has a height of 5 block-lines. The overhead memory needed to address the different scanning direction for the motion estimator 702 independent of the motion-compensation scan direction, is one pixel-block line plus one pixel-block, cf. the example set forth with reference to FIGS. 3 to 5. In practice, therefore, 7 block-lines are needed for a SD sequence in the L1 cache memory 708 for shared access by the motion estimator 702 and the motion compensator 704. The data buffering according to the invention therefore minimizes this overhead and allows reducing the size of the L1 cache memory compared to prior solutions.

The invention claimed is:

1. A data buffering device, comprising:
an input unit adapted to sequentially receive a two-dimensional array of data structures organized by an index pair (i,j) with a first index (j) stepwise traversing first-index values from a first-index value set in a meandering manner defined by a first and a second meandering direction,
a circular buffer memory having a predetermined number of memory locations addressable by means of an ordered set of pointer values,
and a buffer-control unit, which is connected to the circular buffer memory and to the input unit, and which is adapted to assign to an index pair (i,j) of a current incoming data structure a write-pointer value from the pointer-value set in a periodical manner and to write the current incoming data structure to the corresponding memory location, one write-pointer assignment period having
a first write-pointer assignment phase, during which the first index (j) stepwise traverses the first index-value set in the first meandering direction, and the write-pointer value stepwise traverses write-pointer values in a first rotation direction defined within the pointer-value set,
a second write-pointer assignment phase, during which the first index value (j) stepwise traverses the first index-value set in the second meandering direction, and the write-pointer value stepwise traverses write-pointer values in the first rotation direction,
a third write-pointer assignment phase, during which the first index (j) stepwise traverses the first index-value set in the first meandering direction, and the write-pointer value stepwise traverses write-pointer values in a second rotation direction opposite to the first rotation direction, and
a fourth write-pointer assignment phase, during which the first index value (j) stepwise traverses the first index-value set in the second meandering direction, and the write pointer value stepwise traverses write-pointer values in the second rotation direction.

2. The data buffering device of claim 1, wherein the buffer control unit is adapted to receive read requests to the circular-buffer memory for data structures of the two-dimensional array according to a non-meandering read pattern, such that the first index repeatedly traverses the first index-value set in a fixed read direction.

3. The data buffering device of claim 2, wherein the buffer-control unit is adapted to assign a read-pointer value to each index pair (i,j) of a data structure, to which a read request is directed, the read-pointer value being equal to the write-pointer value assigned to the respective index pair (i,j) at the time of storing the corresponding data structure to the circular buffer memory.

4. The data buffering device of claim 3, wherein the number of addressable memory locations of the circular-buffer memory exceeds the number of first-index values by one, and
wherein the buffer-control unit is adapted to assign to an index pair (i,j) of a current incoming read request a read-pointer value from the pointer-value set in a periodical manner, one read-pointer-assignment period having
a first read-pointer assignment phase, which is concurrent with the second write-pointer assignment phase, and in which the read-pointer value stepwise traverses read-pointer values in the first rotation direction, having a pointer-value offset of one step in the first rotation direction over the write-pointer value, and changing from the first to the second rotation direction in the last assigning step,
a second read-pointer assignment phase, which is concurrent with the third write-pointer assignment phase, and in which the read-pointer value stepwise traverses read-pointer values in the second rotation direction, having a pointer-value offset of one step in the second rotation direction over the write-pointer value,
a third read-pointer assignment phase, which is concurrent with the fourth write-pointer assignment phase, and in which the read-pointer value stepwise traverses read-pointer values in the second rotation direction, having a pointer-value offset of one step in the second rotation direction over the write-pointer value, and changing from the second to the first rotation direction in the last assigning step, and
a fourth read-pointer assignment phase, which is concurrent with the first write-pointer assignment phase of a next write-pointer assignment period, and in which the read-pointer value stepwise traverses pointer read-pointer values in the first rotation direction, having a pointer-value offset of one step in the first rotation direction over the write-pointer value.

5. A data processing device, comprising a first processing unit adapted to provide a two-dimensional array of data structures organized by two indices (i,j), each index taking on index values from a respective ordered index-value set, wherein with each provided data structure a first index (j) stepwise traverses first-index values from a first index-value set in a meandering manner defined by a first and a second meandering direction, and, connected to the first processing unit, a data buffering device according to claim 1.

6. The data processing device of claim 5, comprising a second processing unit, which is connected to the data buffering device and adapted to sequentially provide read requests to the circular-buffer memory for data structures of the two-dimensional array according to a non-meandering read pattern, such that the first index (j) repeatedly traverses the first index-value set in a fixed read direction.

7. The data processing device of claim 5, wherein the first processing unit is adapted to perform a motion estimation algorithm, sequentially providing to the circular buffer memory a two-dimensional array of motion vectors allocated to a corresponding two-dimensional array of pixel-data blocks, which form subarrays of a video image.

8. The data processing device of claim 7, wherein the first processing unit is adapted to provide the two-dimensional array of motion vectors in a horizontally meandering order, traversing a first line of the array in a first meandering direction, a following line of the array in the second meandering direction, and a next following line in the first meandering direction.

9. The data processing device of claim 7, wherein the second processing unit is adapted to perform a motion compensation algorithm and to sequentially read the two-dimensional array of motion vectors from the circular buffer memory.

10. The data processing device of claim 9, comprising a low-level cache memory connected to the first processing unit and adapted to hold a current sliding search area, which is allocated to a respective pixel-block and forms a subarray of the two-dimensional array of pixel-data blocks.

11. The data processing device of claim 10, comprising a high-level cache memory, which is connected to the low-level cache memory and connectable to an external memory and which is adapted to hold a region of the two-dimensional array of pixel-data blocks extending over a number of consecutive sliding search areas.

12. The data processing device of claim 9, wherein the second processing unit is adapted to read the two-dimensional array of motion vectors line-by-line, and each line from left to right.

13. A data buffering method, comprising the steps of
receiving a two-dimensional array of data structures organized by two indices (i,j), each index taking on index values from a respective ordered index-value set, wherein with each provided data structure a first index (j) stepwise traverses first-index values from a first index-value set in a meandering manner defined by a first and a second meandering direction, the data processing method comprising the steps of
sequentially storing the data structures received to a circular buffer memory having a predetermined number of memory locations addressable by means of an ordered set of pointer values,
assigning, in a periodical manner, a write-pointer value from the pointer-value set to an index pair of a respective received data structure, one write-pointer assignment period having
a first write-pointer assignment phase, during which the first index (j) stepwise traverses the first index-value set in the first meandering direction, and the write-pointer value stepwise traverses write-pointer values in a first rotation direction defined within the pointer-value set,
a second write-pointer assignment phase, during which the first index value (j) changes in the second meandering direction, and the write-pointer value stepwise traverses write-pointer values in the first rotation direction,
a third write-pointer assignment phase, during which the first index (j) stepwise traverses the first index-value set in the first meandering direction, and the write-pointer value stepwise traverses write-pointer values in a second rotation direction opposite to the first rotation direction, and
a fourth write-pointer assignment phase, during which the first index value (j) changes in the second meandering direction, and the write-pointer value stepwise traverses write-pointer values in the second rotation direction.

14. A data processing method, wherein a first process provides a two-dimensional array of data structures organized by two indices (i,j), each index taking on index values from a respective ordered index-value set, wherein with each provided data structure a first index (j) stepwise traverses first-index values from a first index-value set in a meandering manner defined by a first and a second meandering direction, and wherein a data buffering method according to claim 13 is performed.

15. The data processing method of claim 14, wherein a second process sequentially provides read requests to the circular-buffer memory for data structures of the two-dimensional array according to a non-meandering read pattern, such that the first index (j) repeatedly traverses the first index-value set in a fixed read direction.

16. The data processing method of claim 15, wherein the number of addressable memory locations of the circular-buffer memory exceeds the number of first-index values by one, and comprising the steps of
assigning to an index pair (i, j) of a current incoming read request to the circular buffer memory a read-pointer value from the pointer-value set in a periodical manner, one read-pointer-assignment period having
a first read-pointer assignment phase, which is concurrent with the second write-pointer assignment phase, and in which the read-pointer value stepwise traverses read-pointer values in the first rotation direction, having a pointer-value offset of one step in the first rotation direction over the write-pointer value, and changing from the first to the second rotation direction in the last assigning step,
a second read-pointer assignment phase, which is concurrent with the third write-pointer assignment phase, and in which the read-pointer value stepwise traverses read-pointer values in the second rotation direction, having a pointer-value offset of one step in the second rotation direction over the write-pointer value,
a third read-pointer assignment phase, which is concurrent with the fourth write-pointer assignment phase, and in which the read-pointer value stepwise traverses read-pointer values in the second rotation direction, having a pointer-value offset of one step in the second rotation direction over the write-pointer value, and changing from the second to the first rotation direction in the last assigning step, and
a fourth read-pointer assignment phase, which is concurrent with the first write-pointer assignment phase of a next write-pointer assignment period, and in which the read-pointer value stepwise traverses read-pointer values in the first rotation direction, having a pointer-value offset of one step in the first rotation direction over the write-pointer value.

17. The data processing method of claim 15, comprising the steps of
maintaining a pointer-allocation table, which allocates to each index pair (i,j) corresponding to a data structure currently stored in the circular-buffer memory the respective pointer value, which was assigned to the index pair as the write-pointer value,
look up the respective pointer value allocated to a respective index pair contained in a current read request in the pointer-allocation table,
direct the read request to the memory location having the respective pointer value,
provide the data structure stored in the respective memory location to the second processing section.

18. The data processing method of claim 15, wherein the first process is a motion estimation algorithm, sequentially providing to the circular buffer memory a two-dimensional array of motion vectors allocated to a corresponding two-dimensional array of pixel-data blocks, which form subarrays of a video image.

19. The data processing method of claim 15, wherein the first process provides the two-dimensional array of motion vectors in a horizontally meandering order, traversing a first line of the array in a first meandering direction, a following line of the array in the second meandering direction, and a next following line in the first meandering direction.

20. The data processing method of claim 15, wherein the second process performs a motion compensation algorithm and sequentially reads the two-dimensional array of motion vectors from the circular buffer memory.

21. The data processing method of claim 15, wherein the second process reads the two-dimensional array of motion vectors line-by-line, and each line from left to right.

* * * * *